United States Patent
Alessi et al.

(10) Patent No.: US 9,082,906 B2
(45) Date of Patent: Jul. 14, 2015

(54) PHOTOLUMINESCENT COMPOSITIONS FOR SPECTRUM CONVERTERS WITH ENHANCED EFFICIENCY

(75) Inventors: Andrea Alessi, Novara (IT); Roberto Fusco, Novara (IT); Antonio Alfonso Proto, Novara (IT); Giuliana Schimperna, Novara (IT); Petra Scudo, Pavia (IT)

(73) Assignee: ENI S.p.A., Rome (IT)

( * ) Notice: Subject to any disclaimer, the term of this patent is extended or adjusted under 35 U.S.C. 154(b) by 156 days.

(21) Appl. No.: 13/502,682

(22) PCT Filed: Oct. 14, 2010

(86) PCT No.: PCT/IB2010/002639
§ 371 (c)(1),
(2), (4) Date: Aug. 6, 2012

(87) PCT Pub. No.: WO2011/048458
PCT Pub. Date: Apr. 28, 2011

(65) Prior Publication Data
US 2013/0126787 A1     May 23, 2013

(30) Foreign Application Priority Data
Oct. 19, 2009 (IT) .............................. MI2009A1796

(51) Int. Cl.
| | |
|---|---|
| *C09K 11/06* | (2006.01) |
| *H01L 31/00* | (2006.01) |
| *H01L 31/0256* | (2006.01) |
| *H01L 31/055* | (2014.01) |

(52) U.S. Cl.
CPC ............ *H01L 31/0256* (2013.01); *C09K 11/06* (2013.01); *H01L 31/055* (2013.01); *C09K 2211/1011* (2013.01); *C09K 2211/1051* (2013.01); *Y02E 10/52* (2013.01)

(58) Field of Classification Search
USPC .......................... 252/301.16, 301.35; 136/257
See application file for complete search history.

(56) References Cited

U.S. PATENT DOCUMENTS

2008/0087326 A1     4/2008    Scholes et al.

FOREIGN PATENT DOCUMENTS

JP       2008-162921    *   7/2008

OTHER PUBLICATIONS

Ismail, Y.A.M, et al., "Improvement in light harvesting and performance of P3HT:PCBM solar cell by using 9,10-diphenylanthracene," Solar Energy Materials and Solar Cells, vol. 93, pp. 1582-1586, (May 19, 2009).

Kono, T., et al., "High-Perfomance and Light-Emitting n-Type Organic Field-Effect Transistors Based on Dithienylbenzothiadiazole and Related Heterocycles," Chemical Materials, vol. 19, pp. 1218-1220, (2007).

(Continued)

*Primary Examiner* — Carol M Koslow
(74) *Attorney, Agent, or Firm* — Oblon, McClelland, Maier & Neustadt, L.L.P.

(57) ABSTRACT

The present invention relates to a photoluminescent composition comprising an acene compound having general formula (I) or (Ia) and a benzothiadiazole compound having general formula (II), and the relative use as photoluminescent composition in a spectrum converter. A spectrum converter comprising the photoluminescent composition defined above, comprising the above compounds having general formula (I) or (Ia) and (II) and a solar device comprising said spectrum converter, are also described.

17 Claims, 3 Drawing Sheets

(56) References Cited

OTHER PUBLICATIONS

Figure 1:
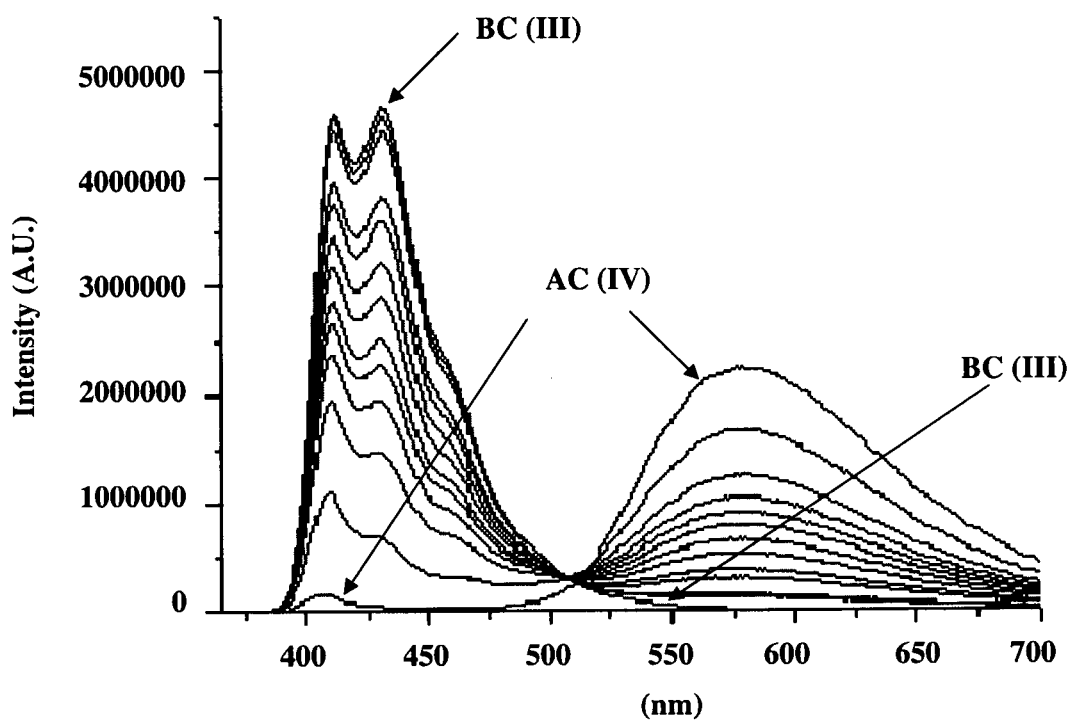

Velusamy, M., et al., "Organic Dyes Incorporating Low-Band-Gap Chromophores for Dye-Sensitized Solar Cells," Organic Letters, vol. 7, No. 10, pp. 1899-1902, (2005).

He, Q., et al., "Amorphous molecular material containing bisthiophenyl-benzothiadiazole and triphenylamine with bipolar and low-bandgap characteristics for solar cells," Thin Solid Films, vol. 516, pp. 5935-5940, (2008).

International Search Report Issued Feb. 4, 2011 in PCT/IB10/02639 Filed Oct. 14, 2010.

Communication pursuant to Article 94(3) EPC issued Jul. 22, 2014 in Patent Application No. 10 785 185.9.

G.D. Sharma, et al., "Bulk heterojunction organic photovoltaic devices based on low band gap small molecule BTD-TNP and perylene-anthracene diimide", Solar Energy Materials & Solar Cells, vol. 93, No. 11, XP026600529, 2009, pp. 2025-2028.

Assunta Marrocchi, et al., "Low-dimensional arylacetylenes for solution-processable organic field-effect transistors", Chemistry of Materials, vol. 21, No. 13, XP055129643, 2009, pp. 2592-2594.

Assunta Marrocchi, et al., "Supporting information Low-dimensional arylacetylenes for solution-processable high-mobility field-effect transistors", http://pubs.acs.org/doi/suppl/1 0.1 021 /cm900734c/suppl_file/ cm900734c_si_001.pdf, XP055129714, 2009, 12 Pages.

* cited by examiner

PHOTOLUMINESCENT COMPOSITIONS FOR SPECTRUM CONVERTERS WITH ENHANCED EFFICIENCY

This application is a 371 of PCT/IB01/02639 filed Oct. 14, 2010. Priority to Italian patent application MI2009A 001796, filed Oct. 19, 2009, is claimed.

The present invention relates to photoluminescent compositions for spectrum converters with an enhanced efficiency.

The present invention is included in the field of photoluminescent compositions which can be used for preparing spectrum converters capable of improving the performances of devices for the exploitation of solar energy (hereinafter called "solar devices"), such as for example photovoltaic cells and photo-electrolytic cells.

In the state of the art, one of the main limits in exploiting solar radiation energy lies in the capacity of solar devices of optimally and exclusively exploiting radiations having wavelengths which fall within a narrow spectral range.

Against a spectral range of solar radiation which extends from wavelengths of about 300 nm to wavelengths of about 2,500 nm, solar cells based on silicon, for example, have an optimum absorption area (effective spectrum) not broader than 300 nm, whereas polymeric solar cells are subject to damage if exposed to radiations having a wavelength lower than about 400 nm, due to induced photodegradation phenomena which become significant below this limit. The efficiency of solar devices of the state of the art is typically maximum within the region of the spectrum between 570 nm and 680 nm (yellow-orange).

The drawbacks previously indicated lead to limited external quantum efficiency (EQE) of the solar device, defined as the ratio between the number of electron-hole pairs generated in the semiconductor material of the solar device and the number of photons inciding on the device.

In order to improve the EQE of solar devices, devices have been developed, which, when interposed between the light radiation source (the sun) and solar device, selectively absorb the inciding radiations having wavelengths outside the effective spectrum of the device, re-emitting the energy absorbed in the form of photons having a wavelength within the effective spectrum. These devices are called "spectrum converters" and can be used in "luminescent concentrators". When the frequency of the photons re-emitted from the converter is higher than that of the inciding photons, the photoluminescence process, comprising the absorption of the solar radiation and subsequent re-emission of photons with a lower wavelength, is also called "up-conversion process". When the frequency of the photons emitted by the converter is lower than that of the inciding photons, on the contrary, the photoluminescence process is called "down-shifting process".

The spectrum converters known in the state of the art typically consist of a support made of a material transparent, as such, to the radiations of interest (for example polymeric or inorganic glass), comprising photoluminescent compounds composed of organic molecules or metallic complexes. In particular, the support is transparent to radiations having a frequency within the effective range of the solar device.

The photoluminescent compounds can be deposited on the glass support in the form of a thin film or, as occurs in the case of polymeric materials, they can be dispersed inside the polymeric matrix. Alternatively, the polymeric matrix can be directly functionalized with photoluminescent chromophore groups.

In order to be used in spectrum converters, the photoluminescent should ideally have the following characteristics:

luminescence quantum efficiency (LQE) equal to 1 (LQE is the ratio between the number of photons emitted and the number of photons absorbed by a luminescent chromophore group);

broad absorption band in the spectral region in which the solar device is poorly efficient;

high absorption coefficient;

narrow emission band well-separated absorption and emission bands.

In order to further enhance the performances of a solar device, it is possible to use photoluminescent compounds having different photoluminescence characteristics, in a combined form, in particular compounds having absorption and/or emission bands in different regions of the solar spectrum. For this purpose, it is possible, for example, to apply thin films containing different photoluminescent compounds to the support of a spectrum converter.

The combined use of two or more photoluminescent compounds in a spectrum converter, according to the known art, has the purpose of capturing a wider range of electromagnetic radiations, thus increasing the total number of photons converted into electric current. This combined use of different photoluminescent compounds, however, does not produce significant improvements in the performances of solar devices. The photoluminescent compounds used in the state of the art, in fact, often have partially superimposed absorption and emission bands, which cause the re-absorption of the photons emitted in the photoluminescence process (auto-quenching). Furthermore, the photoluminescent compounds often have an LQE lower than 1, which therefore limits the number of photons which can be effectively converted into radiations that can be used by a solar device. For a review of the state of the art in this field, reference should be made to E. Klampaftis et al., *Solar Energy Materials & Solar Cells*, vol. 93 (2009), pages 1182-1194.

The objective of the present invention is to overcome the drawbacks described of the state of the art.

A first object of the present invention relates to a photoluminescent composition comprising an acene compound having general formula (I) or (Ia)

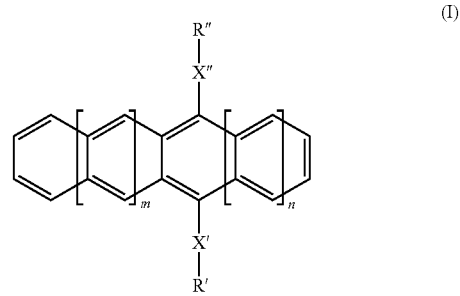

(I)

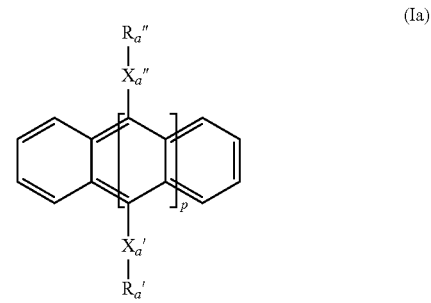

(Ia)

wherein n is an integer varying from 1 to 3, preferably 1, m is an integer varying from 0 to 2, preferably 0, and p is an integer varying from 1 to 3, preferably 1;

R' and R" each independently represent an aromatic or heteroaromatic group, optionally substituted, bonded to X' and, respectively, to X" by means of an atom of the aromatic ring, preferably selected from phenyl, pyrroyl, pyridyl, carbazoyl and their substituted derivatives;

X' and X" are each independently selected from a covalent bond and a divalent —C≡C— or —CH=CH— group;

$R_a'$, $R_a''$, $X_a'$ and $X_a''$ in formula (Ia) respectively have the same meaning as the corresponding groups R', R", X' and X" defined above, or each [$R_a'$—$X_a'$—] or [$R_a''$—$X_a''$—] group is H or an alkyl group having from 1 to 5 carbon atoms, with the proviso that at least one of each $R_a'$, $R_a''$, $X_a'$ and $X_a''$ group has the same meaning as the corresponding R', R", X' and X" groups;

and a benzothiadiazole compound having general formula (II)

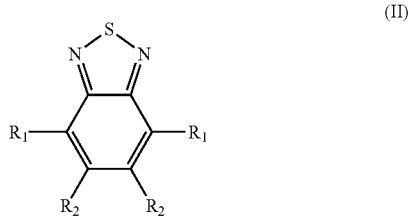

(II)

wherein each $R_1$ is independently an alkinyl group $R_3C\equiv C—$, or an aromatic or heteroaromatic group, optionally substituted, conjugated with the benzene ring of the benzothiadiazole, wherein $R_3$ is H, an alkyl group optionally fluorinated, having from 1 to 8 carbon atoms or an aromatic or heteroaromatic group, optionally substituted, having from 4 to 10 carbon atoms, each $R_2$ is independently H or an alkyl group having from 1 to 10 carbon atoms, and preferably is H.

In the above formulae (I) and (Ia), when the groups X', X", $X_a'$ or $X_a''$ represent a covalent bond, the respective groups R', R", $R_a'$ and $R_a''$ are directly bound to the carbon atom of the acene nucleus of formulae (I) or (Ia) by means of a covalent bond.

Preferred substituent groups of R' or R", and the corresponding $R_a'$ and $R_a''$, are —F, —OH, —OR, —R, —ROH, —OROH, —NHR, —CN, phenyl, fluorophenyl, wherein R is a linear or branched alkyl group, containing from 1 to 10 carbon atoms. Said preferred groups can also be substituents of $R_3$ in one or both of the $R_1$ groups of formula (II). More preferably, $R_1$, R', R", $R_a'$ and $R_a''$ are substituted with 1 to 5 atoms of F. According to another preferred aspect of the present invention, the groups R' and R", in formula (I), $R_a'$ and $R_a''$, in formula (Ia), and $R_1$ in formula (II), if different from alkinyl, if substituted, are substituted with one or more of the above substituent groups in a different position from ortho position.

From the previous definition of formula (Ia), it is evident that when $R_a'$ or $R_a''$ are an aromatic or heteroaromatic group, the respective groups $X_a'$ or $X_a''$ are necessarily selected from a covalent bond and a divalent group —C≡C— or —CH=CH—.

Preferred R'X', R"X", $R_a'X_a'$ and $R_a''X_a''$ groups are phenyl ($C_6H_5—$), ethynylphenyl ($C_6H_5C\equiv C—$) or styryl ($C_6H_5CH=CH—$), possibly substituted with one or more fluorine atoms.

In the compounds having formula (Ia) wherein p is 2 or 3, the groups $R_a'X_a'$ and, $R_a''X_a''$, respectively, bound to two different aromatic rings of the acene nucleus, can be the same or different from each other.

Preferred $R_1$ groups are thienyl (—$C_4H_3S$), thienylethynyl (—C≡C—$C_4H_3S$), pyridyl (—$C_5H_4N$), optionally substituted with one or more fluorine atoms.

Particularly preferred compositions are those in which the two $R_1$ groups in formula (II), the groups R'X' and R"X", in formula (I), and the groups $R_a'X_a'$ and $R_a''X_a''$ in formula (Ia), are respectively the same as each other.

A second object of the present invention relates to the use of the compositions as defined above as a photoluminescent composition in a spectrum converter.

Object of the present invention is also a spectrum converter comprising the photoluminescent composition defined above, comprising the above compounds having general formulae (I) or (Ia) and (II).

A further object of the present invention relates to a solar device comprising a spectrum converter as defined above.

The Applicant has surprisingly found that by using the photoluminescent compositions according to the present invention, which contemporaneously comprise the above compounds having general formulae (I) or (Ia) (hereunder also indicated for the sake of simplicity as acene compounds) and general formula (II) (hereunder also indicated as benzothiadiazole compounds) in a spectrum converter, thanks to the particular interaction of the photoluminescence characteristics of the above acene and benzothiadiazole compounds, it is possible to enhance the conversion efficiency of solar radiation.

More specifically, the combined and simultaneous use of the above compounds in a photoluminescent composition allows a wide portion of the radiations of the solar spectrum to be intercepted (radiation absorbed), re-emitting them at lower frequencies (radiation emitted), within a narrower spectral range, much more effectively than spectrum converters of the state of the art. The radiations emitted preferably have a wavelength which falls within the effective spectrum wavelength range of a solar device.

The acene compounds having general formulae (I) and (Ia) absorb radiations having a wavelength within the range of 250-400 nm and re-emit them by photoluminescence within the range of 400-550 nm, coinciding with at least one absorption band of the compound having general formula (II).

The benzothiadiazole compounds having general formula (II), have the fundamental characteristic of having at least one absorption band within the range of 400-600 nm, i.e. in correspondence with the spectral region in which the photoluminescence emission of the acene compounds takes place. The compounds having general formula (II) are also characterized in that their photoluminescence emission falls within the range of 500-800 nm, i.e. within the spectrum which can generally be effectively used by solar devices of the inorganic type, particularly based on crystalline Si, amorphous Si, CdTe (Cadmium Telluride), CIGS (Copper Indium Gallium diSelenide). Furthermore the above two ranges of 400-600 nm and 500-800 nm are sufficiently distanced as to enable the so-called autoquenching phenomenon to be substantially reduced, i.e. the partial absorption of the radiation emitted by the same photoluminescent compound. Thanks to the superimposition of the spectral photoluminescence emission regions of the acene compounds and the absorption regions of the benzothiadiazole compounds, the radiation emitted from the acene compounds—which falls outside the effective spectrum of the solar devices described above—is absorbed by the benzothiadiazole compounds and further converted, with a high efficiency, to radiation with a lower wavelength. The selection of photoluminescent compounds according to the present invention produces an absorption/emission mechanism of cascade radiations, which allows inciding radiations having wavelengths within a wide spectral range to be converted into radiations with a lower wavelength (down-shifting) and, at the same time, to concentrate them in a spectral range where they can be effectively exploited by a solar device.

The photoluminescent compositions, object of the present invention are characterized by an unexpected and high efficiency deriving from the combination of the following factors:

a) high absorption coefficients and luminescence quantum efficiencies of the compounds having general formulae (I) and (II), b) effective superimposition of the emission bands of the acene compounds with the absorption bands of the benzothiadiazole compounds, c) distinct separation of the absorption and emission bands of the benzothiadiazole compounds.

In particular, the distinct separation of the emission and absorption bands which distinguish the benzothiadiazole compounds prevents, or at least considerably attenuates, the luminescence autoquenching phenomenon, one of the main reasons for the limited effectiveness of the spectrum converters known in the state of the art.

The photoluminescence properties of the acene and benzothiadiazole compounds can be varied within narrow limits, by suitably selecting the type of substituents (R', R", $R_a'$, $R_a"$ and $R_1$) and, in the case of the structure of general formulae (I) and (Ia), the number of condensed aromatic rings.

In the case of acene compounds having general formula (I) or (Ia), with an increase in the value of n, m, or p, i.e. the number of condensed rings, the extension of the π-conjugated electron system increases, with a consequent variation in the luminescence properties of the compound. Generally, with an increase in the π-conjugation, i.e. with an increase in n, a shift of the absorption and emission bands of the luminescent compounds towards higher wavelengths, can be observed.

The compounds having general formulae (I) or (Ia) and (II) have been found to be particularly effective compounds, according to the present invention, which have properties of molecular symmetry, i.e. having a substantially symmetrical structure with respect to the rotation at 180° on the symmetry axis C2 of the benzothiadiazole ring of the compounds having formula (II) and on the axis transversal to the coplanar rings of the acene compounds (I) and (Ia).

In the case of benzothiadiazole compounds having general formula (II), in order to obtain an effective conversion of the wavelength of the inciding radiation, it is preferable for the ($R_1$) substituent groups of the benzene ring in position 3 and 4 to be substantially identical, i.e. they do not significantly differ in the structure and composition of the conjugated groups.

In the composition, object of the present invention, a compound of the anthracene type substituted in positions 9 and 11 is preferably present, i.e. a compound having general formula (I) wherein n=1.

In the case of anthracene (n=1), tetracene (n=2) and pentacene (n=3) structures, the substituent groups R' and R" of the acene compound, are phenyl groups, more preferably, R'X' and R"X" are phenylethynyl groups.

Particularly preferred is the following compound having formula (III), corresponding to the compound having general formula (I) wherein n=2 and R is a phenyl group.

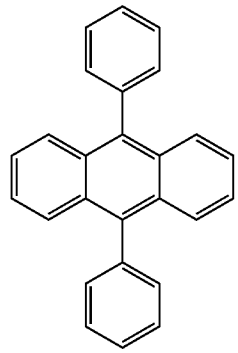

Among the benzothiadiazole compounds, the following compound having formula (IV), is particularly preferred, corresponding to the compound having general formula (II) wherein the substituent $R_1$ is a thienyl group

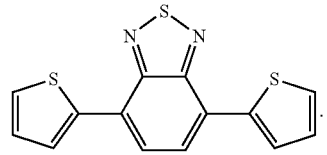

In a preferred embodiment of the present invention, the compound having formula (III) is used in a combination with the compound having formula (IV).

In another preferred embodiment, the composition of the present invention consists of anthracene substituted in position 9, 10 with pentafluorophenyl and the compound having the previous formula (IV).

In the compositions, object of the present invention, the compounds having formulae (I) or (Ia) and (II) are present in proportions between each other that can vary within wide limits, depending on various factors, such as the respective molar absorbance and emission coefficients, but also the commercial availability or complexity of the preparation. It has generally been found that satisfactory results are obtained when the molar ratio between the compound having formula (I) or (Ia) and the compound having formula (II) ranges from 0.2 to 5.0, preferably from 0.5 to 2.0, more preferably from 0.9 to 1.1.

The concentrations of the chromophores having formula (I), (Ia) and (II) in the polymeric matrixes, in the solutions or gels in which they can be dispersed, generally range from 0.05% to 10%, preferably from 0.1% to 5%, by weight.

Figure 2:
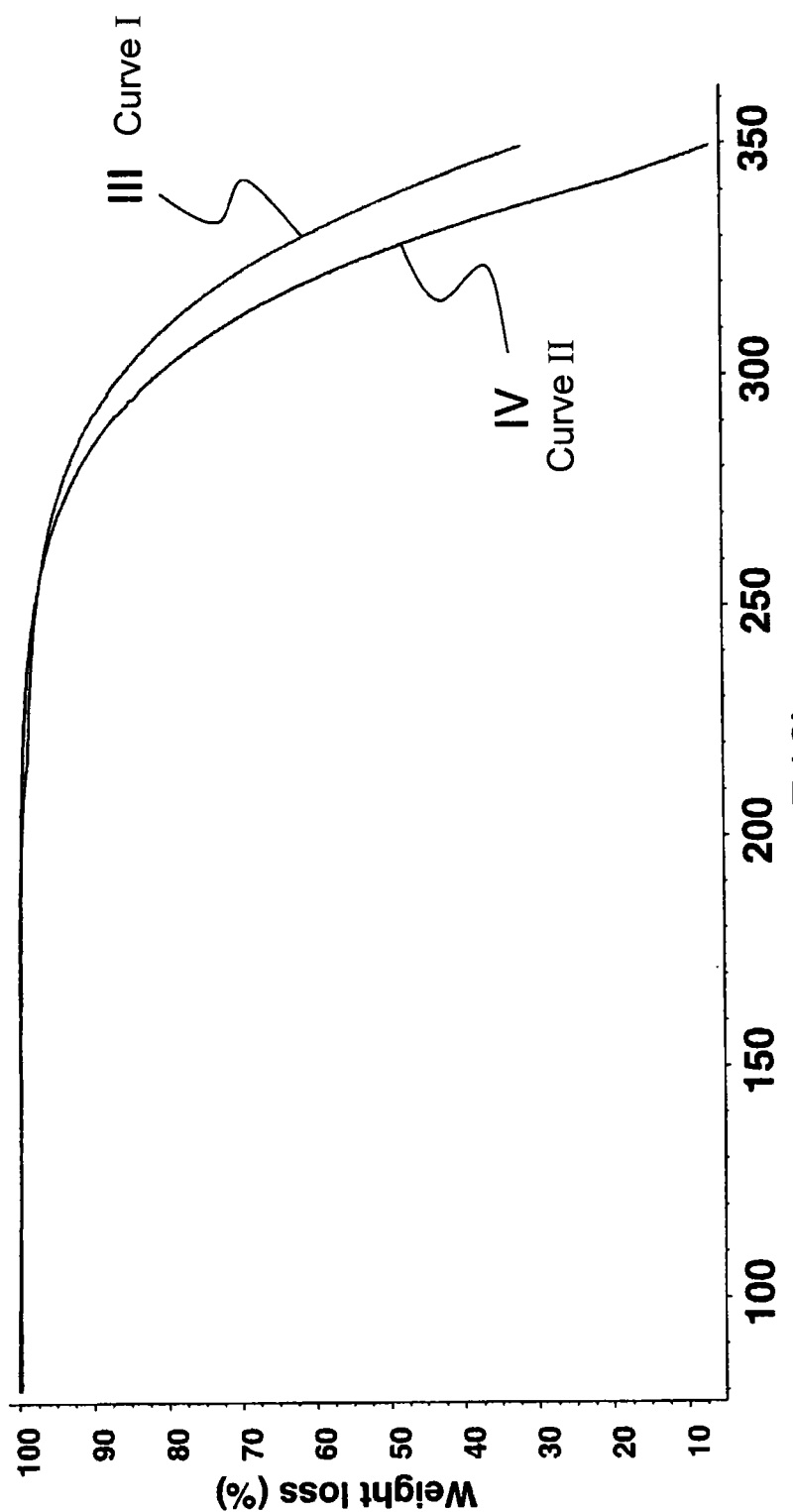
Figure 3:
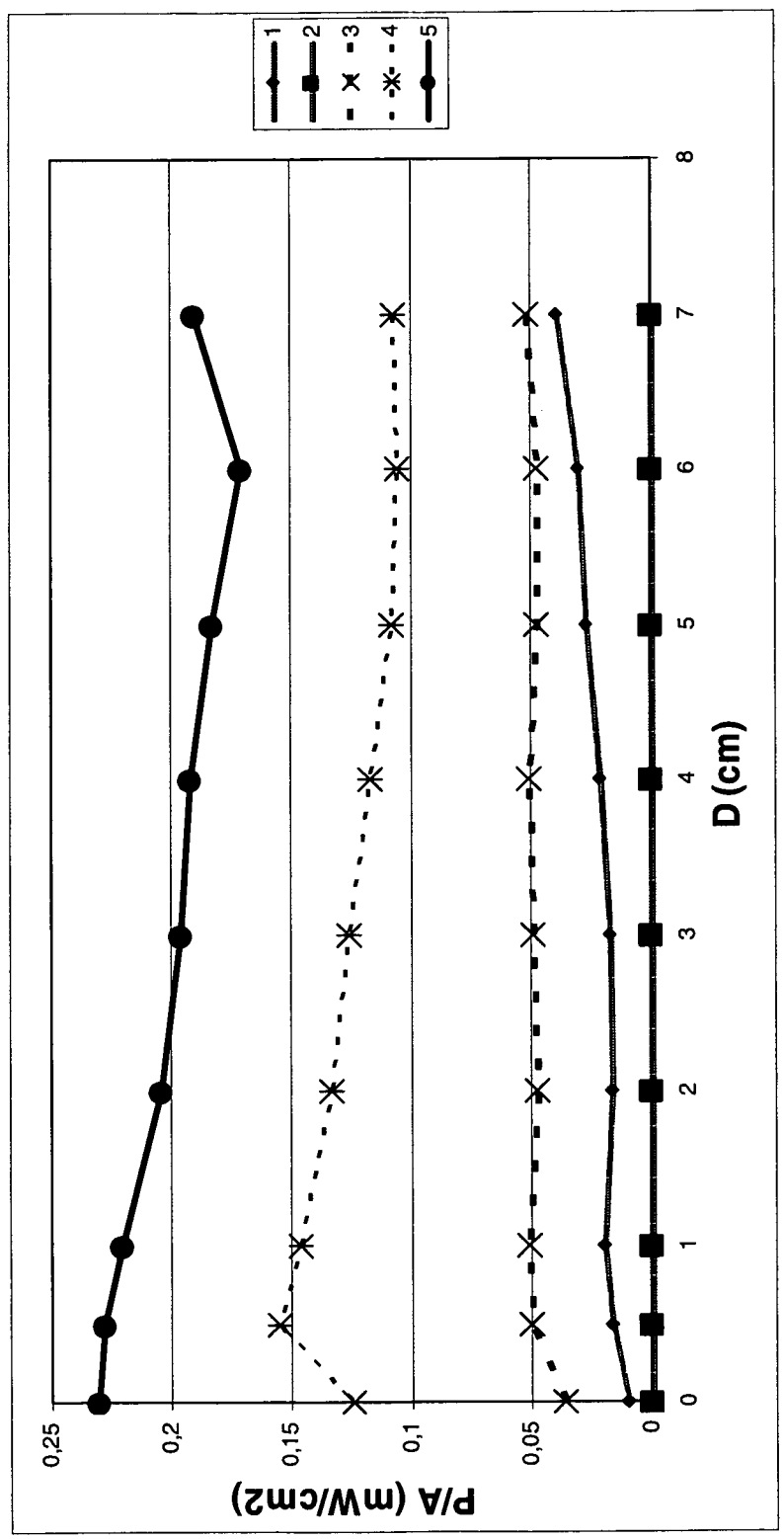

In order to have a better understanding of the characteristics of the present invention, reference is made hereunder to the following figures:

FIG. 1: photoluminescence spectra in a solution of dichloromethane of mixtures of compounds having formula (III) and (IV), with a variation in the concentration of the compound having formula (IV) (wavelength of the excitation radiation equal to 355 nm);

FIG. 2: thermogravimetric analysis of the compound having formula (III) (curve (I)) and of the compound having formula (IV) (curve (II));

FIG. 3: Curves for Power (P)/surface (A) illuminated in relation to the distance (D) of the coverage from the edge of the support containing the solar cells of solar devices containing different luminescent compounds.

The surprising efficacy of the combined use of the acene and benzothiadiazole compounds, specifically those having formula (III) and (IV) in the photoluminescent compositions according to the present invention, in a spectrum converter is confirmed by the photoluminescence spectra indicated in FIG. 1.

These spectra refer to solutions containing only the compound having formula (III) (spectrum BC(III)) and to the same solution to which increasing amounts of the compound having formula (IV) have been added (the spectrum AC(IV) corresponds to the maximum concentration of the compound having formula (IV)). The spectra of FIG. 1 show how the radiation emitted from the compound having formula (III) (emission bands centred at 412 nm and 431 nm), in the presence of a compound having formula (IV), is absorbed by the latter to be subsequently re-emitted with the production of a more intense overall photoluminescence at convenient wavelengths (525-670 nm).

The acene compounds having general formula (I), (Ia) and (II) are compounds which are commercially available or which can be synthesized according to synthesis processes known in the art.

The compounds having general formula (I) and (II) have a high thermal stability, as indicated by the thermogravimetric curves of FIG. 2 specifically referring to the compounds having formula (III), (curve (III)) and (IV) (curve (IV)). The thermogravimetric analysis shows that both compounds are stable up to a temperature of at least 240° C.

The thermal stability of the photoluminescent compounds which can be used in the compositions according to the present invention allows spectrum converters to be prepared by the dispersion of these compounds in the molten state in polymeric materials, such as for example, polymethylmethacrylate (PMMA), polystyrene and polyvinylacetate (PVA).

Alternatively, the spectrum converters can be prepared by functionalizing the polymeric matrix used as support in the convertor with the above photoluminescent compounds, for example by means of imidization reactions in the molten state. In this latter case, the compounds having general formula (I), (Ia) and (II) must comprise at least one substituent group of the type NHR as indicated above, which guarantees its anchorage to the polymeric chains of the polyacrylic material used as support. The photoluminescent compounds can also be introduced, for example, by the copolymerization reaction between a traditional acrylic monomer and another acrylic monomer containing the photoluminescent compound as substituent.

The spectrum converters of the present invention can be produced in the form of prisms or polymeric sheets to be coupled with the solar devices. Alternatively, according to a different known construction technique, the spectrum converters can be produced by forming a thin film laid on the surface of a transparent sheet or prism made of an organic or inorganic vitreous material, such as glass or polymethylmethacrylate.

The compositions, object of the present invention, produce the advantageous conversion and concentration effects of the inciding light radiations described above, not only in solution, but also in gel form.

The following embodiment example is provided for purely illustrative purposes of the present invention and should not be considered as limiting the protection scope defined by the enclosed claims.

EXAMPLE

The following spectrum converters were prepared starting from a polymeric support composed of polymethylmethacrylate (PMMA) (dimensions: 90×90×6 mm) on which a thin film was deposited, having a thickness ranging from 300 to 350 μm of PMMA to which one or more photoluminescent compounds had been added. For this purpose, a solution is prepared in 1,2-dichlorobenzene (12 ml) containing PMMA (6 g), diphenylanthracene (DPA) (66 mg, 1% mol) and dithienylbenzothiodiazole (DTB) (67 mg, 1% mol). This solution is uniformly deposited on a sheet of PMMA (dimensions: 90×90×6 mm) with the use of a filmograph of the Dr. Blade type. The solvent is then left to completely evaporate at room temperature and under a light stream of air for at least 24 hours.

The following spectrum converters were prepared:

Converter S1 (reference): converter consisting of the polymeric support of PMMA alone, without the deposition of any thin film;

Converter S2 (reference): converter in which the thin PMMA film does not contain photoluminescent compounds;

Converter S3 (comparative): converter in which the compound having formula (III) (1.0% mol) has been added to the thin film of PMMA;

Converter S4 (comparative): converter in which the compound having formula (IV) (1.0% mol) has been added to the thin film of PMMA;

Converter S5 (according to the present invention): converter in which a photoluminescent composition comprising the compounds having formula (III) (1.1% by weight of the solution used for depositing the thin film) and (IV) (1.1% by weight of the solution used for depositing the thin film), has been added to the thin film of PMMA.

A different solar device was then prepared with each of these spectrum converters, applying nine solar cells IXYS-XOD17, in series, having a total surface of 9×6×6 mm, to one of the edges of the polymeric support of each converter.

The solar devices were subjected to measurements of the electric power generated due to illumination of the main side of the polymeric sheet coated with the thin film containing the photoluminescent compounds, with a power source equal to 1 sun (1,000 W/mq).

The power measurements were effected by covering surfaces with an opaque coating (masking), having a variable area of the polymeric support, at a decreasing distance with respect to the edge containing the solar cells. The measurements were then repeated using a masking with a fixed area to eliminate any possible edge and multiple diffusion effects generated by the irradiation of the whole surface of the sample. The measurements, effected under variable and fixed screening conditions, allow the contribution of possible waveguide, edge or multiple diffusion effects due to the support, to be quantified and then subtracted.

The measurements of the power generated were processed in the form of curves for the Power (P)/Surface (A) illuminated in relation to the distance of the coverage (masking) from the edge of the support containing the solar cells (FIG. 3).

FIG. 3 shows the curves 1-5, relating to the generated power values per area unit in relation to the distance of the masking from the edge of the support containing the solar cells deposited on the converters S1-S5. The curves 1-5 were normalized with respect to the contribution of the reference S1 (curve 1) relating to a measurement on the polymeric support alone.

The results illustrated in FIG. 3 show that the converter S5, containing the compounds having formula (III) and (IV), according to the present invention, has a much greater efficiency of the solar device with respect to the converters according to the state of the art.

The absolute numerical values (i.e. without the subtraction of possible contributions due to waveguide, edge or multiple diffusion effects due to the support) of the maximum power measured for each converter, are indicated in the following table, and confirm the excellent results which can be obtained with the photovoltaic devices comprising the converters according to the present invention.

| Sample | P (mW) | Luminescent compound |
|--------|--------|---------------------|
| S1 | 7.79 | None |
| S2 | 6.57 | None |
| S3 | 10.37 | Compound having formula (III) |
| S4 | 18.42 | Compound having formula (IV) |
| S5 | 24.03 | Compound having formula (III) and (IV) |

The invention claimed is:

1. A photoluminescent composition, comprising an acene compound of formula (I) or (Ia) and a benzothiadiazole compound of formula (II):

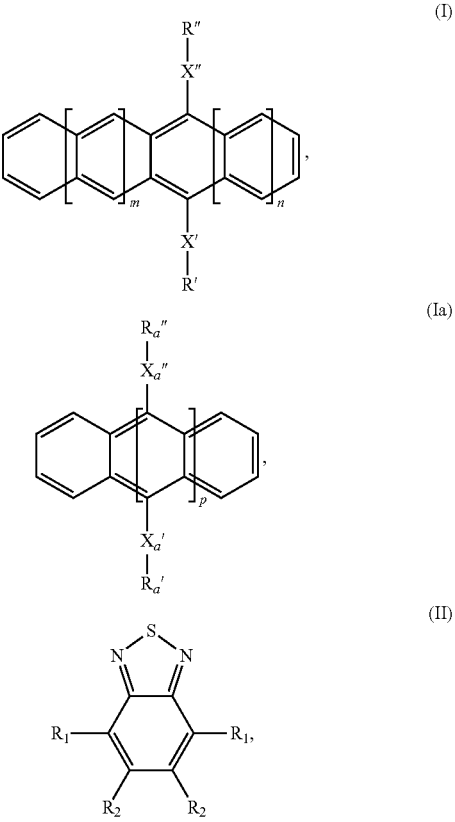

wherein:
n is an integer from 1 to 3;
m is an integer from 0 to 2;
p is an integer from 1 to 3;
R' and R" each independently represent an optionally substituted aromatic or heteroaromatic group bonded to X' and, respectively, to X" through an atom of the ring of the aromatic or heteroaromatic group;
X' and X" are each independently selected from the group consisting of a covalent bond, a divalent —C≡C— group, and a —CH═CH— group;
$R_a'$, $R_a''$, $X_a'$ and $X_a''$ in formula (Ia) respectively have the same meaning as the corresponding groups R', R", X' and X" defined above, or each [$R_a'$—$X_a'$—] or [$R_a''$—$X_a''$—] group is H or an alkyl group having from 1 to 5 carbon atoms, with the proviso that at least one of each $R_a'$, $R_a''$, $X_a'$ and $X_a''$ group has the same meaning as the corresponding R', R", X' and X" groups;
each $R_1$ is independently an alkinyl group $R_3C$≡$C$—, or an optionally substituted aromatic or heteroaromatic group conjugated with the benzene ring of the benzothiadiazole, wherein $R_3$ is H, an optionally fluorinated alkyl group having from 1 to 8 carbon atoms, or an optionally substituted aromatic or heteroaromatic group having from 4 to 10 carbon atoms;
each $R_2$ is independently H or an alkyl group having from 1 to 10 carbon atoms, and
wherein $R_1$, R', R", $R_a'$ and $R_a''$ are substituted with from 1 to 5 F atoms.

2. The composition according to claim 1, wherein two $R_1$ groups in formula (II), groups R' and R" in formula (I), and groups $R_a'$, $R_a''$ in formula (Ia), are respectively the same as each other.

3. The composition according to claim 1, wherein $R_1$ is a thienyl group (—$C_4H_3S$), a thienylethynyl group (—C≡C—$C_4H_3S$), or a pyridyl group (—$C_5H_4N$), substituted with one or more fluorine atoms.

4. The composition according to claim 1, wherein R'X', R"X", $R_a'X_a'$ and $R_a''X_a''$ are selected from the group consisting of phenyl ($C_6H_5$—), ethynylphenyl ($C_6H_5C$≡$C$—), and styryl ($C_6H_5CH$═$CH$—), substituted with one or more fluorine atoms.

5. The composition according to claim 1, wherein, in compounds of formula (I), substituent groups R' and R" are phenyl groups.

6. The composition according to claim 1, wherein a molar ratio between the compound of formula (I) or (Ia) and the compound of formula (II) ranges from 0.2 to 5.0.

7. The composition according to claim 1, wherein compounds (I) or (Ia) and (II) are in solution, in the form of a gel, or dispersed in polymeric materials.

8. The composition according to claim 7, wherein compounds (I) or (Ia) and (II) are in solution, in the form of a gel, or dispersed in polymeric materials and wherein a concentration of the compounds of formulas (I) or (Ia) and (II) in polymeric materials, in solutions or in gels ranges from 0.05% to 10% by weight.

9. The composition according to claim 1, wherein the aromatic or heteroaromatic group of R' and R" is selected from the group consisting of a phenyl, a pyrroyl, a pyridyl, a carbazoyl and their substituted derivatives.

10. The composition according to claim 1, comprising said acene compound of formula (I) and said benzothiadiazole compound of formula (II).

11. The composition according to claim 1, comprising said acene compound of formula (Ia) and said benzothiadiazole compound of formula (II).

12. A photoluminescent composition, comprising an acene compound of formula (I) or (Ia) and a benzothiadiazole compound of formula (IV):

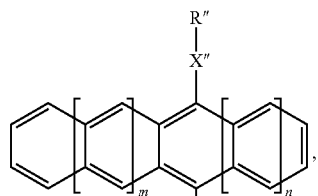
(I)

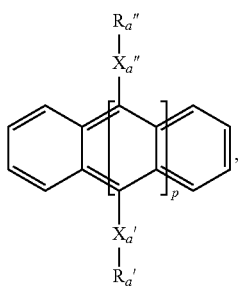
(Ia)

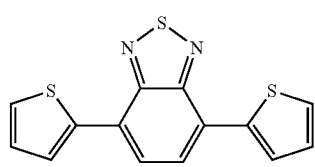
(IV)

wherein:
n is an integer from 1 to 3;
m is an integer from 0 to 2;
p is an integer from 1 to 3;
R' and R" each independently represent an optionally substituted aromatic or heteroaromatic group bonded to X' and, respectively, to X" through an atom of the ring of the aromatic or heteroaromatic group;
X' and X" are each independently selected from the group consisting of a covalent bond, a divalent —C≡C— group, and a —CH=CH— group; and
$R_a'$, $R_a"$, $X_a'$ and $X_a"$ in formula (Ia) respectively have the same meaning as the corresponding groups R', R", X' and X" defined above, or each [$R_a'$—$X_a'$—] or [$R_a"$—$X_a"$—] group is H or an alkyl group having from 1 to 5 carbon atoms, with the proviso that at least one of each $R_a'$, $R_a"$, X' and $X_a"$ group has the same meaning as the corresponding R', R", X' and X" groups.

13. A composition comprising a compound of formula (III) and a benzothiazole compound of formula (IV):

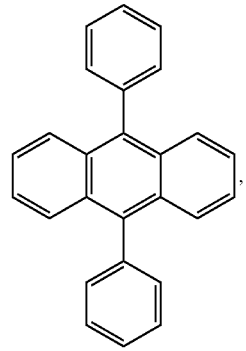
(III)

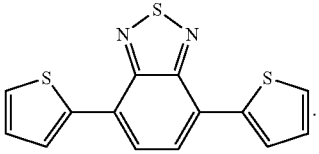
(IV)

14. A composition comprising 9,10-pentafluorophenylanthracene and a compound of formula (IV):

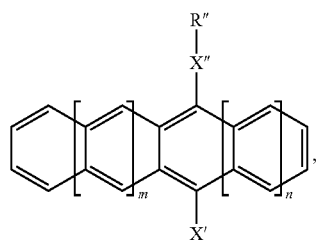
(IV)

15. A spectrum converter, comprising a photoluminescent composition, said photoluminescent composition comprising an acene compound of formula (I) or (Ia) and a benzothiadiazole compound of formula (II):

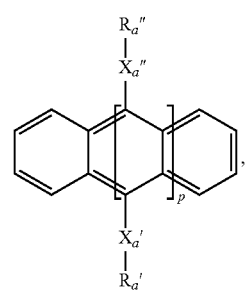
(I)

(Ia)

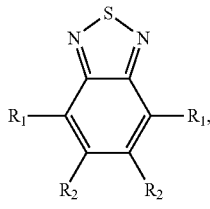

(II)

wherein:

n is an integer from 1 to 3;

m is an integer from 0 to 2;

p is an integer from 1 to 3;

R' and R" each independently represent an optionally substituted aromatic or heteroaromatic group bonded to X' and, respectively, to X" through an atom of the ring of the aromatic or heteroaromatic group;

X' and X" are each independently selected from the group consisting of a covalent bond, a divalent —C≡C— group, and a —CH=CH— group;

$R_a'$, $R_a''$, $X_a'$ and $X_a''$ in formula (Ia) respectively have the same meaning as the corresponding groups R', R", X' and X" defined above, or each $[R_a'—X_a'—]$ or $[R_a''—X_a''—]$ group is H or an alkyl group having from 1 to 5 carbon atoms, with the proviso that at least one of each $R_a'$, $R_a''$, $X_a'$ and $X_a''$ group has the same meaning as the corresponding R', R", X' and X" groups;

each $R_1$ is independently an alkinyl group $R_3C≡C—$, or an optionally substituted aromatic or heteroaromatic group conjugated with the benzene ring of the benzothiadiazole, wherein $R_3$ is H, an optionally fluorinated alkyl group having from 1 to 8 carbon atoms, or an optionally substituted aromatic or heteroaromatic group having from 4 to 10 carbon atoms;

each $R_2$ is independently H or an alkyl group having from 1 to 10 carbon atoms.

16. A solar device, comprising the spectrum converter according to claim 15.

17. A photoluminescent composition, comprising an acene compound of formula (I) and a benzothiadiazole compound of formula (II):

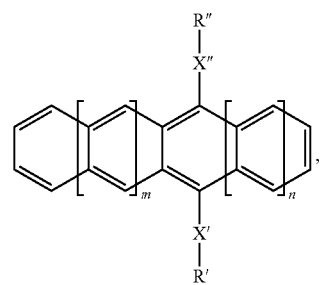

(I)

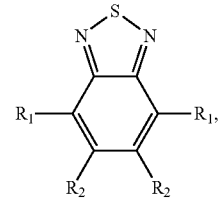

(II)

wherein:

n is an integer from 1 to 3;

m is an integer from 0 to 2;

p is an integer from 1 to 3;

each $R_1$ is independently an alkinyl group $R_3C≡C—$, or an optionally substituted aromatic or heteroaromatic group conjugated with the benzene ring of the benzothiadiazole, wherein $R_3$ is H, an optionally fluorinated alkyl group having from 1 to 8 carbon atoms, or an optionally substituted aromatic or heteroaromatic group having from 4 to 10 carbon atoms;

each $R_2$ is independently H or an alkyl group having from 1 to 10 carbon atoms wherein in compounds of formula (I), substituent groups R'X' and R"X" are phenylethynyl groups.

* * * * *